United States Patent

Fichtner

[15] 3,675,142

[45] July 4, 1972

[54] TRANSISTOR POWER AMPLIFIER WITH DC OUTPUT VOLTAGE STABILIZATION

[72] Inventor: Roland H. Fichtner, Ontario, Canada

[73] Assignee: Electrohome Limited, Kitchener, Ontario, Canada

[22] Filed: March 5, 1971

[21] Appl. No.: 121,473

[52] U.S. Cl. ....................................330/17, 330/15, 330/22, 330/25

[51] Int. Cl. ..........................................H03f 3/18, H03f 3/04

[58] Field of Search.............................330/13, 15, 17, 22, 25

[56] References Cited

UNITED STATES PATENTS

| | | | |
|---|---|---|---|
| 2,789,164 | 4/1967 | Stanley | 330/13 |
| 3,376,388 | 4/1968 | Reiffin | 330/25 |

*Primary Examiner*—Roy Lake

*Assistant Examiner*—Lawrence J. Dahl

*Attorney*—Sim & McBurney

[57] ABSTRACT

A transistor power amplifier comprises a voltage amplifier DC coupled with a current amplifier and provided with a network that inhibits the flow of DC current through the voice coil of a loudspeaker connected between the output terminals of the amplifier.

9 Claims, 3 Drawing Figures

INVENTOR.
ROLAND H. FICHTNER
BY

*INVENTOR.*
ROLAND H. FICHTNER
*BY*

TRANSISTOR POWER AMPLIFIER WITH DC OUTPUT VOLTAGE STABILIZATION

This invention relates to transistor power amplifiers. More particularly, this invention relates to DC output voltage stabilization of a transistor power amplifier. This invention also relates to turn-on transient suppression networks for transistor amplifiers.

A conventional transistor power amplifier used, for example, for final audio amplification in a radio receiver or the like employs an output electrolytic capacitor for DC blocking. Such a capacitor is expensive and restricts the response of the amplifier at the low end of the frequency spectrum. However, if the return lead of the loudspeaker or other sound transducer is to be grounded, it is important for the DC output voltage of the amplifier also to be at ground potential and reasonably stabilized in order to avoid DC current flowing through the loudspeaker voice coil. Also it is required that the amplifier have symmetrical positive and negative supply voltages so that the loudspeaker can be driven symmetrically.

In accordance with this invention, there is provided a simple and inexpensive network that meets the foregoing requirements without requiring an output electrolytic capacitor and without resort to another solution to the problem which is effective but expensive, namely the use of differential amplifiers.

In order to minimize the audibility of the turn-on transient of a DC coupled transistor amplifier, it is known to shift the frequency of the turn-on transient into the subsonic region by applying bias for the amplifier slowly through a time constant network. In some cases, however, it may be desirable to supply a part of the bias voltage immediately and the rest slowly.

In accordance with a second aspect of this invention, a turn-on transient suppression network that achieves the foregoing result is provided.

This invention will become more apparent from the following detailed description, taken in conjunction with the drawings, in which.

Figure 1:
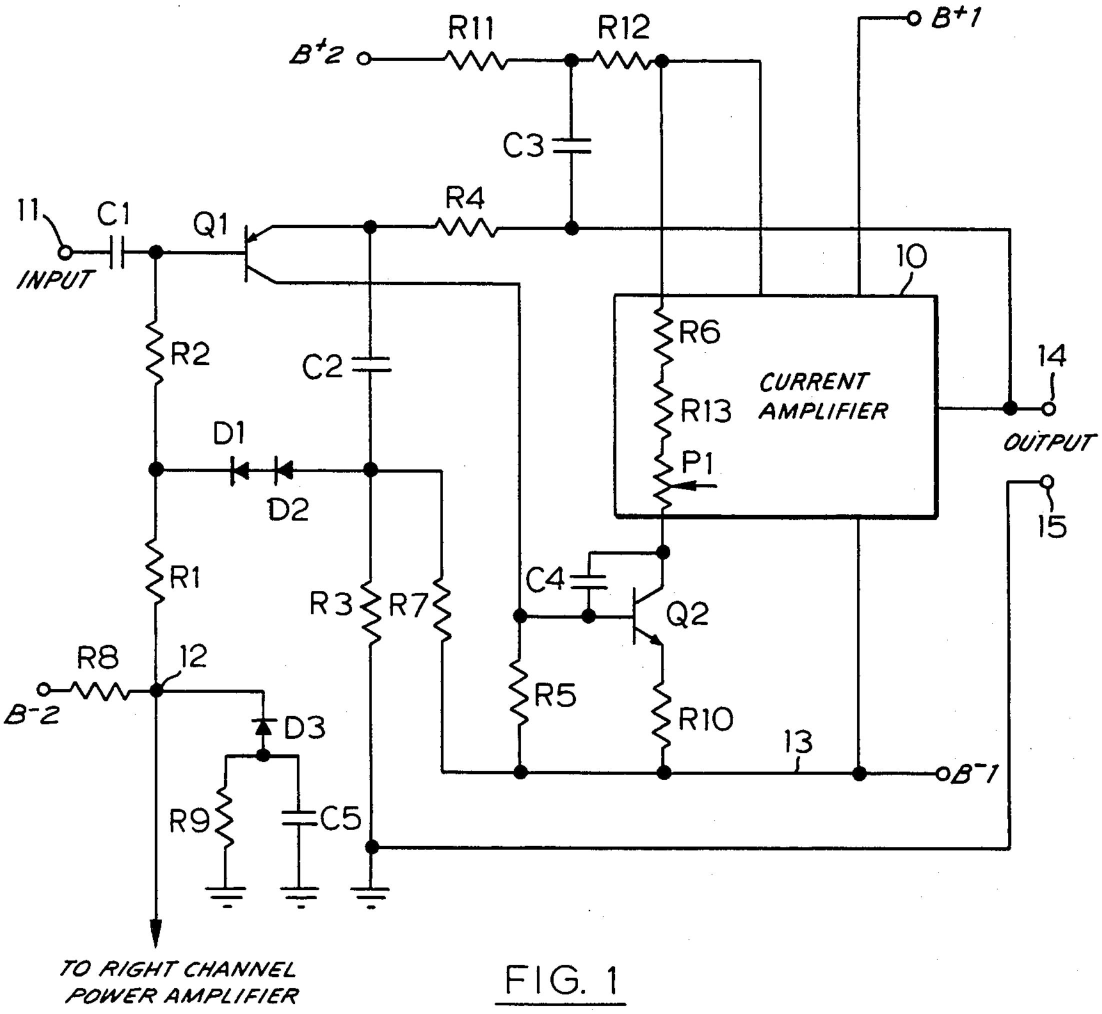
FIG. 1 is a circuit diagram of an amplifier embodying this invention.
Figure 2:
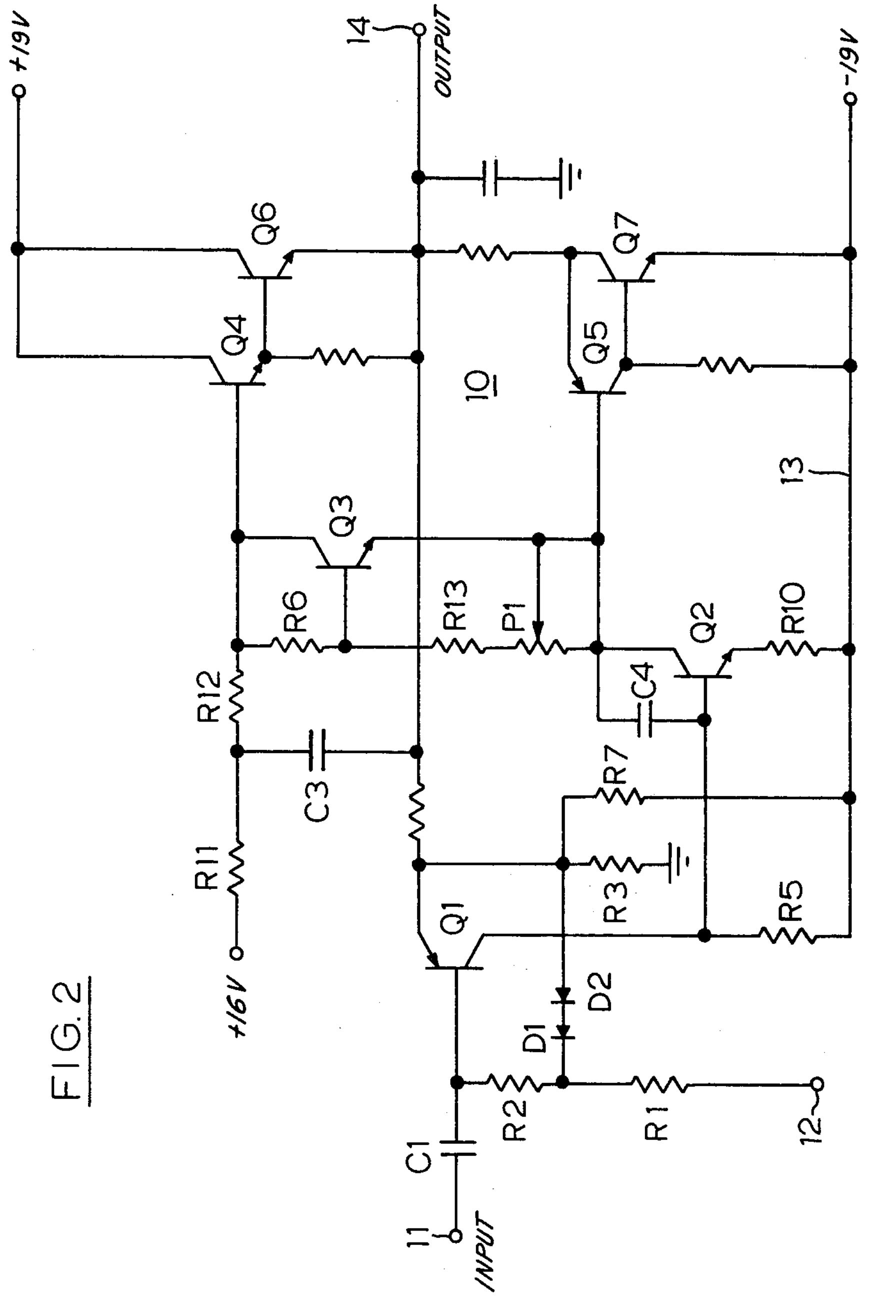
FIG. 2 is a circuit diagram of the amplifier of FIG. 1 in greater detail.

Shown in FIG. 1 is a conventional, two stage, DC coupled voltage amplifier comprising transistors Q1 and Q2, the latter being DC coupled to a conventional current amplifier 10. The latter comprises transistors Q3, Q4, Q5, Q6 and Q7 connected as shown in FIG. 2. However, since the current amplifier is conventional, per se does not constitute the invention and could be of a different type than shown, no specific description thereof or of its mode of operation will be included herein other than to note that the current amplifier or impedance transformer is a combination of Darlington emitter followers having a high input impedance, a very low output impedance and a voltage gain slightly less than unity.

Input signals to the amplifier are applied to the input terminal 11 thereof and via a coupling capacitor C1 to the base electrode of transistor Q1. Bias for transistor Q1 is supplied from a turn-on transient suppression network consisting of resistors R8 and R9, a diode D3 and a capacitor C5. Resistor R9 and capacitor C5 are connected in parallel between ground and the anode of diode D3, the cathode of diode D3 being connected to a terminal 12 that is connected via a resistor R8 to a terminal at a suitable negative DC potential, $B^-2$. Terminal 12 is connected via series connected resistors R1 and R2 to the base electrode of transistor Q1.

The collector electrode of transistor Q1 is DC coupled to the base electrode of transistor Q2 and via a resistor R5 to a line 13 at a suitable negative DC potential $B^-1$. This line also is connected via a resistor R10 to the emitter electrode of transistor Q2.

The collector electrode of transistor Q2 is connected to a terminal at a suitable DC potential, $B^+2$, via series connected resistors R11, R12, R6 and R13 and a series connected potentiometer P1, a capacitor C4 being connected between the collector and base electrodes of transistor Q2 and serving as a conventional high frequency shunt for reducing the high frequency roll off of the voltage amplifier to below that of the current amplifier.

The output terminal of the power amplifier is designated 14, and the loudspeaker (not shown) to which the amplifier delivers its output signal is connected between terminal 14 and a grounded terminal 15.

A conventional, negative DC feedback connection from output terminal 14 via a resistor R4 to the emitter electrode of transistor Q1 is provided and gives a DC gain of practically 1. Connected between the common terminal of resistors R11 and R12 and the terminal of resistor R4 connected to output terminal 14 is a capacitor C3. Resistors R11 and R12 and capacitor C3 constitute a conventional bootstrap circuit that provides a high dynamic load impedance for the collector of transistor Q2.

A capacitor C2 and a resistor R3 are connected in series between the emitter electrode of transistor Q1 and ground. Resistor R4, capacitor C2 and resistor R3 constitute an AC feedback network (negative feedback) which determines the AC gain of the complete amplifier, this AC gain being equal to R4/R3. Between the common terminal of resistors R1 and R2 and the common terminal of capacitor C2 and resistor R3 are series connected two silicon diodes D1 and D2, the diodes being connected in the same direction and forward biased by $B^-2$ via resistors R8 and R1. The common terminal of capacitor C2 and resistor R3 also is connected via a hum bucking resistor R7 to line 13.

The operation of the circuit of FIG. 1 now will be described. From a DC point of view, current flows from $B^-2$ via resistor R8, resistor R1, diodes D1 and D2 and resistor R3 to ground. This current may be of the order of 1 ma, and there will be a voltage drop across diodes D1 and D2 totaling 1.1 volts (0.55 volts across each diode). By proper choice of resistor values and the operating current of transistor Q1, the sum of the voltage drops across resistors R2 and R4 plus the base to emitter voltage drop of transistor Q1 can be made equal to the sum of the voltage drops across diodes D1 and D2 and across resistor R3. Since the circuits for which these voltages are summed are in parallel and resistor R3 is grounded, the DC output voltage at output terminal 14 necessarily must be at ground potential as required. In actual fact the base to emitter voltage drop of transistor Q1 is about equal to the drop across one of diodes D1 and D2, so the voltage drop across the other diode compensates for the voltage drops across resistors R2 and R4, the larger voltage drop being across resistor R4, and the voltage drop across resistor R3 being negligible.

In order to minimize the effect of current gain variations of transistor Q2 (different transistors of the same type have different $h_{fe}$'s), it is desirable to choose the collector current of transistor Q1 to be 5 to 10 times the required base current of transistor Q2. In this way, and with resistor R5 shunting the base-emitter path of transistor Q2, the value of resistor R5 rather than the base current of transistor Q2 determines the voltage drop across resistor R4. More specifically, the collector and emitter currents of transistor Q1 are practically the same, and if most of this current flows through resistor R5 rather than being the base current of transistor Q2, transistor Q2, regardless of its $h_{fe}$, will not much affect the collector and emitter currents of transistor Q1 and hence the voltage drop across resistor R4. This voltage drop then is stabilized.

In order to minimize the effect of current gain variations of transistor Q1 upon the output voltage, Q1 should be a high $h_{fe}$ type of transistor and resistor R2 should be made small, and resistor R3 should be very small to minimize the effect of $B^-2$ voltage variations.

From an AC point of view, since resistor R2 is small, it would be an intolerable shunt in the signal path. This is conventionally overcome by means of bootstrapping. In the network of this invention, however, the conventional bootstrapping capacitor has been eliminated and replaced by diodes D1 and D2. In order to provide the necessary bootstrapping of resistor R2, the anode of diode D2 is not connected to ground, as it would be obvious to do for DC reasons, but rather to the junction of resistor R3 and capacitor C2, the latter being a large capacitor. This connection puts diodes D1 and D2 as well as the junctions of resistors R1 and R2 at the AC emitter voltage of transistor Q1, thereby providing the necessary bootstrapping of resistor R2.

Strictly by way of example, the following components may have the values indicated hereinafter:

| | Resistors (ohms) | Capacitors |
|---|---|---|
| | R1 4.7K | C2 500 μfd |
| | R2 33K | C3 80 μfd |
| | R3 15 | C4 47 pfd |
| | R4 2.2K | C5 125 μfd |
| | *R5 3.3K or 3.9K | |
| | R6 1000 | |
| | R7 100K | |
| | R8 10K | |
| | R9 33K | |
| | R10 18 | |
| | R11 1.8K | |
| | R12 1.8K | |
| | R13 470 | |
| | P1 470 | |
| transistor | Q1 - high gain, low noise Si - PNP | |
| transistor | Q2 - high gain, GP** Si - NPN | |
| diode D1 - | GP Si | |
| diode D2 - | GP Si | |
| diode D3 - | GP Si | |

*value of resistor R5 depends upon make of diodes D1 and D2
**GP means general purpose.

The operation of the turn-on transient suppression network shown in FIG. 1 but, for the sake of simplification, omitted from FIG. 2, now will be described.

Bias voltage for transistor Q1 is supplied from B-2, say, −12 volts via resistors R8, R1 and R2. When At this applied, the bias voltage at terminal 12 will increase immediately to the point where diode D3 starts conducting. 8t his point there will be a voltage drop of about 11.3 volts across resistor R8 and about 0.7 volts from the cathode of diode D3 to ground. As capacitor C5 charges, the voltage at terminal 12 will increase slowly in a negative direction to a final value of about −8 volts, the time constant for charging being given by the formula $$T=\frac{C5}{\frac{1}{R8}+\frac{1}{R9}}$$

Figure 3:
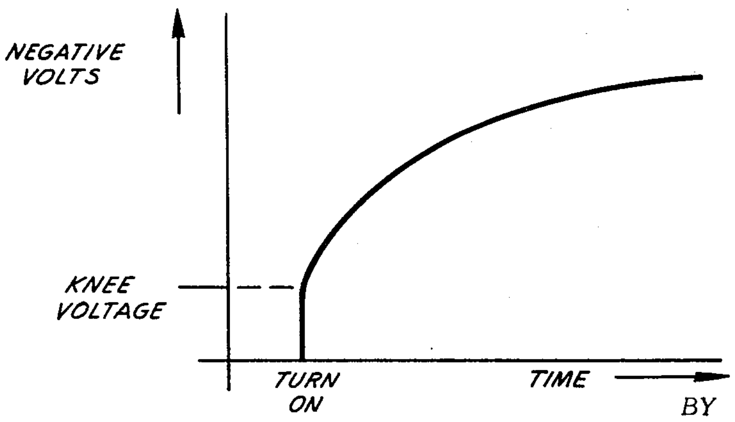
FIG. 3 is the bias voltage turn-on curve of the amplifier of FIG. 1 on a plot of voltage against time.

The bias voltage turn-on curve (the voltage at terminal 12) is shown in FIG. 3. The knee voltage (0.7 volts) is determined by diode D3. If a different knee voltage is required, two or more diodes or a Zener diode may be used. Resistor R9 serves, of course, to discharge capacitor C5 when the amplifier is turned off.

It will be understood that FIG. 1 shows an amplifier that may be the left channel power amplifier of a stereophonic receiver and that an identical right channel power amplifier may be provided.

While a preferred embodiment of this invention has been described, those skilled in the art will appreciate that changes and modifications may be made therein without departing from the spirit and scope of the invention as defined in the appended claims.

What I claim as my invention is:

1. A transistor power amplifier comprising a voltage amplifier having an input terminal and an output terminal, a current amplifier having an input terminal and an output terminal, means DC coupling said output terminal of said voltage amplifier and said input terminal of said current amplifier and a DC feedback network, said voltage amplifier comprising input and output DC coupled amplifying stages, said stages including first and second transistors respectively each having base, emitter and collector electrodes, first and second terminals at different DC potentials, first and second series connected resistors connected between said first terminal and said base electrode of said input transistor and thereby providing bias for said input transistor, a network connected between said first and second terminals and including said first resistor, a diode network including at least one diode connected in forward biased configuration and a third resistor connected in series with each other, said DC feedback network being connected between said output terminal of said current amplifier and said emitter electrode of said input transistor and including a fourth resistor, said second, third and fourth resistors and the operating current of said input transistor being selected such that the sum of the base-emitter voltage drop of said input transistor and the voltage drops across said second and fourth resistors equals the sum of the voltage drop across said diode network and the voltage drop across said third resistor, whereby the DC potential of said output terminal of said current amplifier equals the DC potential of said second terminal.

2. The invention according to claim 1 including a first capacitor, said first capacitor being connected between said emitter electrode of said input transistor and said third resistor; said fourth resistor, said first capacitor and said third resistor being connected in series circuit and providing an AC feedback network.

3. The invention according to claim 1 wherein there are two of said diodes each connected in forward biased configuration.

4. The invention according to claim 1 including means DC coupling said collector electrode of said input transistor and said base electrode of said output transistor and a fifth resistor connected to said base electrode of said output transistor in a network bypassing said base electrode of said input transistor and carrying most of the collector current of said input transistor.

5. The invention according to claim 4 wherein said collector current of said input transistor is at least five times the base current of said output transistor.

6. The invention according to claim 2 wherein there are two of said diodes each connected in forward biased configuration.

7. The invention according to claim 6 including means DC coupling said collector electrode of said input transistor and said base electrode of said output transistor and a fifth resistor connected to said base electrode of said output transistor in a network bypassing said base electrode of said input transistor and carrying most of the collector current of said input transistor.

8. The invention according to claim 1 including a turn-on transient suppression network, said turn-on transient suppression network comprising fifth and sixth resistors, a first capacitor and another diode connected in forward biased configuration, said fifth resistor being connected between said first terminal and said first resistor, said first capacitor being connected in a circuit to be charged via said fifth resistor and said other diode, said sixth resistor being connected in a circuit for discharging said capacitor.

9. The invention according to claim 2 including a turn-on transient suppression network, said turn-on transient suppression network comprising fifth and sixth resistors, a first capacitor and another diode connected in forward biased configuration, said fifth resistor being connected between said first terminal and said first resistor, said first capacitor being connected in a circuit to be charged via said fifth resistor and said other diode, said sixth resistor being connected in a circuit for discharging said capacitor.

* * * * *

PO-1050
(5/69)

UNITED STATES PATENT OFFICE
CERTIFICATE OF CORRECTION

Patent No. 3,675,142 Dated July 4, 1972

Inventor(s) Roland H. Fichtner

It is certified that error appears in the above-identified patent and that said Letters Patent are hereby corrected as shown below:

Claim 4, line 5, change "input" to "output".

Claim 7, line 5, change "input" to "output".

Claim 9, line 3, change "first" to "second".

Same claim, line 6, change "first" (second occurrence) to "second".

Same claim, last line, before "capacitor" insert "second".

Signed and sealed this 26th day of December 1972.

(SEAL)
Attest:

EDWARD M.FLETCHER,JR.
Attesting Officer

ROBERT GOTTSCHALK
Commissioner of Patents